US006711397B1

(12) United States Patent
Petrov et al.

(10) Patent No.: US 6,711,397 B1
(45) Date of Patent: Mar. 23, 2004

(54) STRUCTURES AND METHODS FOR DIRECT CONVERSION FROM RADIO FREQUENCY MODULATED SIGNALS TO BASEBAND SIGNALS

(75) Inventors: Andrei R. Petrov, Pocatello, ID (US); Craig L. Christensen, Pocatello, ID (US); Kenneth L. Reinhard, Pocatello, ID (US)

(73) Assignee: AMI Semiconductor, Inc., Pocatello, ID (US)

( * ) Notice: Subject to any disclaimer, the term of this patent is extended or adjusted under 35 U.S.C. 154(b) by 599 days.

(21) Appl. No.: 09/716,305

(22) Filed: Nov. 20, 2000

(51) Int. Cl.[7] .............................. H04B 1/26; H04D 3/18
(52) U.S. Cl. ...................... 455/324; 455/326; 455/317; 455/296; 375/328; 375/324
(58) Field of Search ................................. 455/324, 326, 455/303, 304, 305, 306, 310, 313, 317, 296; 363/136, 124, 138, 43; 375/261, 318, 319, 320, 328, 324

(56) References Cited

U.S. PATENT DOCUMENTS

| | | | | |
|---|---|---|---|---|
| 4,208,711 A | * | 6/1980 | Baker .......................... 363/136 |
| 4,736,390 A | | 4/1988 | Ward et al. .................... 375/75 |
| 4,811,425 A | | 3/1989 | Feerst ......................... 455/317 |
| 4,814,715 A | | 3/1989 | Kasperkovitz ............... 329/50 |
| 5,263,194 A | | 11/1993 | Ragan ......................... 455/316 |
| 5,303,417 A | | 4/1994 | Laws ........................... 455/314 |
| 5,507,036 A | | 4/1996 | Vagher ......................... 455/295 |
| 5,787,126 A | | 7/1998 | Itoh et al. .................... 375/340 |
| 5,893,029 A | | 4/1999 | Bastani ....................... 455/324 |
| 5,894,499 A | | 4/1999 | Katayama et al. .......... 375/334 |
| 5,943,370 A | | 8/1999 | Smith ........................... 375/334 |
| 5,974,306 A | | 10/1999 | Hornak et al. ............... 455/323 |
| 6,006,079 A | | 12/1999 | Jaffee et al. ................. 455/310 |
| 6,021,323 A | | 2/2000 | Vagher ......................... 455/324 |
| 6,073,001 A | | 6/2000 | Sokoler ....................... 455/323 |
| 6,169,463 B1 | * | 1/2001 | Mohindra et al. ........... 332/104 |
| 6,192,225 B1 | * | 2/2001 | Arpaia et al. ............. 455/196.1 |
| 6,230,000 B1 | | 5/2001 | Tayloe ......................... 455/323 |
| 6,442,381 B1 | * | 8/2002 | Downey et al. ............. 455/265 |

OTHER PUBLICATIONS

Direct Conversion Prepares for Cellular Prime Time Patrick Mannion Communications Technology, pp. 85, 86, 88, 90, 92, 94, 95.
Virtual LO Tunes Direct–Conversion Receivers Tajinder Manku Microwaves & RF, Jan. 2000, pp. 107, 108, 110, 112.
C–Band Direct Conversion Receiver Front–End Using a Resistive Fet Mixer Sylvia Lin, Yongxi Qian, and Tatsuo Itoh 1999 IEEE MTT–S International Microwave Symposium Digest, vol. 4, Jun. 13–19, 1999, pp. 1409, 1410, 1411.

* cited by examiner

Primary Examiner—Duc M. Nguyen
(74) Attorney, Agent, or Firm—Workman Nydegger (57) ABSTRACT

A direct conversion receiver is disclosed that converts RF signal into corresponding quadrature baseband signals without requiring conversion through an intermediate frequency. The direct conversion receiver abates local oscillator leakage, increases dynamic range and increases RF selectivity as compared to conventional direct conversion circuits. The circuit includes an in-phase branch and a quadrature-phase branch, each branch including two mixers instead of the conventional one. Each mixer is provided with balanced control signals that include a primary control signal and a complementary control signal. For each branch, the signals from the mixer pass through an operational amplifier and a low pass filter to extract the corresponding baseband signal component.

13 Claims, 7 Drawing Sheets

STRUCTURES AND METHODS FOR DIRECT CONVERSION FROM RADIO FREQUENCY MODULATED SIGNALS TO BASEBAND SIGNALS

BACKGROUND OF THE INVENTION

1. The Field of the Invention

The present invention relates to wireless radio receiver technology and, more specifically, to improved circuits and methods for the direct conversion of radio frequency modulated signals to baseband signals without requiring conversion through an intermediate frequency.

2. The Prior State of the Art

Electrical signals have proven to be an effective means of conveying data from one location to another. The further a signal is transmitted, however, the greater the decay in the signal and the greater the chance for irreversible loss in the data represented by the signal. In order to guard against this signal decay, the core electrical signal that represents the data (i.e., the baseband signal) may be modulated or superimposed on a carrier wave in the Radio Frequency (RF) frequency spectrum.

In order to properly interpret the signal, conventional RF receivers demodulate the baseband signal from the received signal. The data represented by the extracted baseband signal may then be interpreted by other downstream circuitry.

In order to perform this demodulation, typical receivers include circuitry which first converts the received radio frequency modulated signal into an intermediate frequency ("IF") signal. This intermediate frequency signal is then converted into the baseband signal for further data processing. Receiver architectures that convert through the intermediate frequency are often called "heterodyne" receiver architectures. Naturally, circuit elements (called "IF components") are required in order to deal with the intermediate conversion to and from the intermediate frequency.

It is desirable to reduce the cost, size, and power consumption of a particular receiver architecture design for strategic marketing of the receiver. This is particularly true of wireless RF receivers since those receivers are often portable and run on battery power.

One technology developed in order to reduce RF receiver cost, size, and power consumption is called "direct conversion." Direct conversion refers to the direct conversion of RF modulated signals into corresponding baseband signals without requiring conversion through the intermediate frequency. Such direct conversion receiver architectures are often called "zero-IF," "synchrodyne," or "homodyne" receiver architectures.

Figure 1:
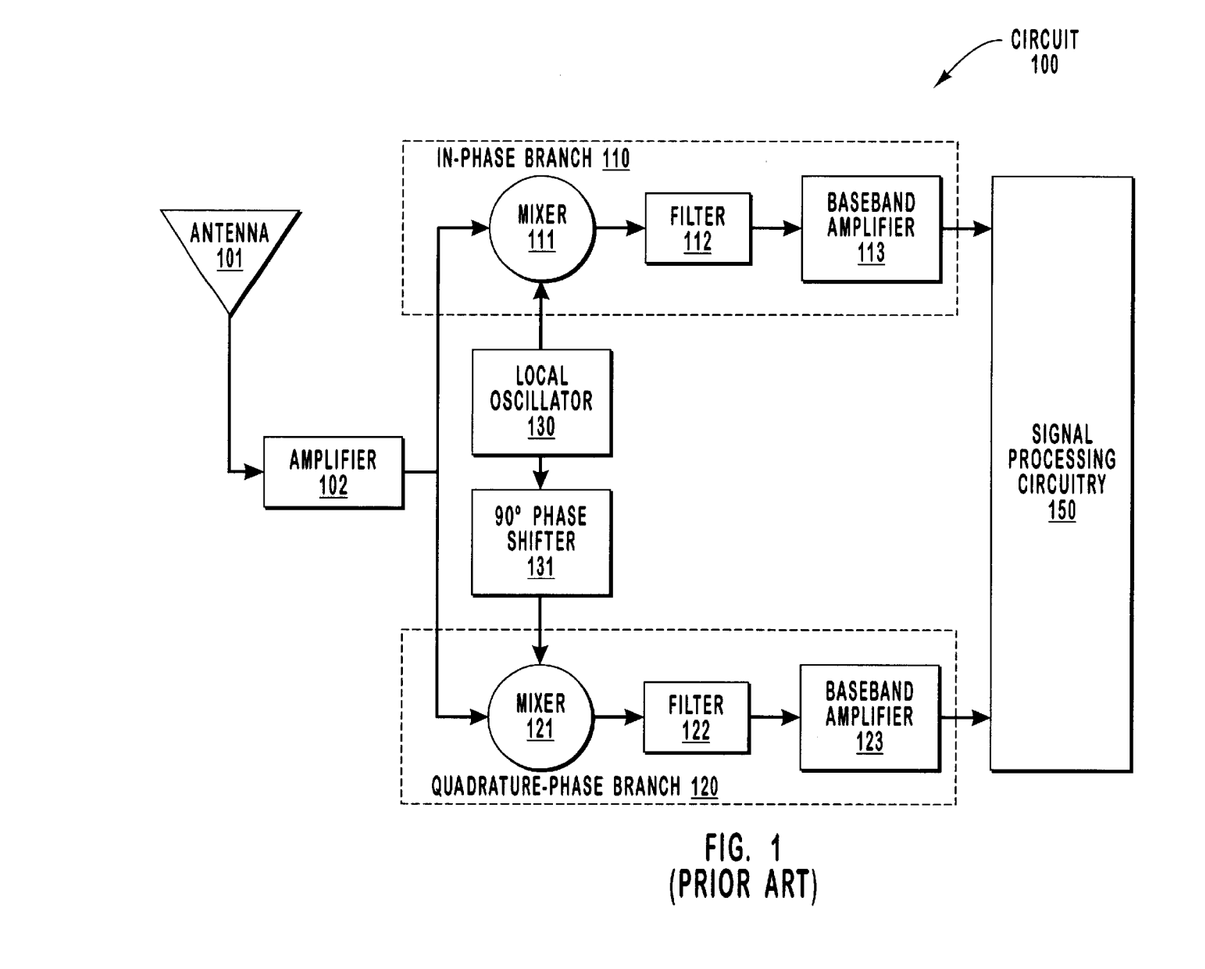
FIG. 1 illustrates a direct conversion circuit in accordance with the prior art in which one mixer is provided for each of the in-phase and quadrature-phase branches.

FIG. 1 illustrates a conventional direct conversion circuit 100 in accordance with the prior art. The circuit 100 includes an antenna 101 which receives the RF modulated signal. The antenna then provides the received signal to an amplifier 102 which amplifies the signal for further processing. The amplifier 102 may be, for example, an RF low noise amplifier.

The amplified signal is then split into two branches, an "in-phase" branch 110, and a "quadrature-phase" branch 120. Each branch includes a mixer that initially receives the amplified signal. For instance, the in-phase branch 110 includes an in-phase mixer 111, and the quadrature-phase branch 120 includes a quadrature-phase mixer 121. A local oscillator 130 provides a sine or square wave signal as a control signal to each of the mixers. Each mixer is configured to nonlinearly process the amplified signal and control signal, resulting in output signal components at frequencies equal to the sum and difference of amplified signal and control signal frequencies, plus higher-order components at other frequencies. The circuit includes a 90-degree phase shifter 131 which causes the control signal for the quadrature-phase mixer 121 to be 90 degrees out of phase with the control signal for the in-phase mixer 111.

The signal from the in-phase mixer 111 is then passed through a low pass filter 112 to a baseband amplifier 113 to complete the extraction of the baseband (difference frequency) signal from the received signal as far as the in-phase branch 110 is concerned. Likewise, the signal from the quadrature-phase mixer 121 is passed through a low pass filter 122 to a baseband amplifier 123 to complete the extraction of the baseband (difference frequency) signal as far as the quadrature-phase branch is concerned. The quadrature baseband signals are then processed by signal processing circuitry 150.

The direct conversion circuit of FIG. 1 does not convert through an intermediate frequency and thus there are no IF components needed to deal with an intermediate conversion. Consequently, the direct conversion circuit of FIG. 1 is smaller, and requires less power than conventional heterodyne receiver architectures, which perform intermediate conversion.

However, there are some performance issues for the direct conversion circuit of FIG. 1 that limit its practical implementation. First, there is often local oscillator leakage to the antenna 101, to the amplifier 102 input and to the mixer inputs. This results in local oscillator Direct Current (DC) self-mixing products that can overpower and degrade the baseband signals. Second, the antenna may radiate the local oscillator leakage causing an interference problem for other nearby receivers. This may also cause a time-varying self-mixing product due to radiated RF leakage reflecting off nearby objects, possible in motion, and being received back at the same antenna, then adding to the leakage component present at the antenna terminal. Third, there is a lack of RF selectivity, combined with amplifier and mixer limited dynamic range, resulting in direct AM detection of high level, in-band or adjacent channel interference. The net result of these performance degradations is that there may be some loss of data in the baseband signals and some interference with the operation of nearby receivers.

What is therefore desired are circuits and methods for direct conversion of RF modulated signals directly into baseband signals without intermediate conversion through and intermediate frequency while reducing the above-described problems related to oscillator leakage, interference with surrounding antennas, self-mixing products at the antenna, low RF selectivity, and limited dynamic range.

SUMMARY OF THE INVENTION

A direct conversion receiver converts a radio frequency modulated (RF) signal into a corresponding baseband signal without requiring conversion through an intermediate frequency. The direct conversion receiver abates local oscillator leakage, increases dynamic range and increases RF selectivity as compared to conventional direct conversion circuits.

After being received and amplified as necessary, the RF signal is provided to two branches of the direct conversion circuit, an "in-phase" branch and a "quadrature-phase" branch." However, instead of the conventional one mixer per branch, each branch includes two mixers. These four mixers periodically pass on the RF signal if the corresponding control signal provided to the mixer is high. A local oscillator provides the controls signals in the form of binary waves which have the same period, nominally, as the carrier period of the RF signal. Each mixer is provided with a primary binary control signal having a duty cycle of approximately 25 percent in the logic "high" state and a corresponding binary complement signal having a duty cycle of approximately 75 percent in the logic "high" state. The quarter-period "high" states of the primary control signals are time-shifted, from one control signal to the next, to produce quadrature-phased, primary binary control signals with relative phases of approximately 0, 90, 180, and 270 degrees.

As for the in-phase branch, a first mixer has an output terminal coupled to the positive terminal of the operational amplifier. This first mixer is provided with a corresponding first primary binary control signal. A second mixer in the in-phase branch has an output terminal that is coupled to the negative terminal of the operational amplifier. This second mixer is provided with a second primary control signal that is 180 degrees out of phase as compared to the first primary control signal. An operational amplifier receives the signal passed by the two mixers in the in-phase branch and generates a signal that represents the difference between the two signals provided by the mixers. The resulting signal is then passed through a low pass filter to generate a first baseband signal.

As for the quadrature-phase branch, a first mixer has an output terminal coupled to the positive terminal of another operational amplifier. This first mixer is provided with a corresponding primary binary control signal that is 90 degrees out of phase. A second mixer in the quadrature-phase branch has an output terminal that is coupled to the negative terminal of the operational amplifier. This second mixer is provided with a primary control signal that is 270 degrees out of phase. This operational amplifier receives the signal passed by the two mixers in the quadrature-phase branch and generates a signal that represents the difference between the two signals provided by the mixers. The resulting signal is then passed through another low pass filter to generate a second baseband signal. The two quadrature baseband signals are then provided to signal processing circuitry for further processing.

The direct conversion circuit described herein has many advantages over conventional direct conversion circuits. Specifically, the signals provided to each mixer are balanced complementary signals. Thus, any leakage from a pair of complementary signals tends to cancel each other out. Also, the superposition of the two primary switching control signals provided to each branch is a square wave at twice the RF carrier frequency. Likewise, the superposition of the two complementary switching control signals provided to each branch is also a square wave at twice the RF carrier frequency.

Also, coupling of the four switching control signal waveforms in the two switching mixers of each branch via a capacitive leakage path to a distant node results in an "impulse train" at that node which is balanced. Impulse trains occur at the leading and lagging edges of the control signals thus forming a positive-going impulse train at four times the receive frequency and a coincident negative-going impulse train at four times the receive frequency. Thus, coupling along balanced leakage paths tend to cancel each other.

In addition, the superposition of all eight control signals is a balanced waveform that contains no spectral components at the receive frequency. These effects combine to reduce the local oscillator leakage to surrounding components including the antenna.

Furthermore, the circuit results in reduced AM detection in the mixers due to the use of switches for mixers, as opposed to "active" mixer implementations such as Gilbert cells. Switching mixers can be implemented with active semiconductor switching devices where the degree of non-linearity incurred across the switch itself in the "on" state is less than with Gilbert cells or semiconductor diode ring devices. Therefore, larger second order and third order intercept values can be realized.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 4A$i$ is a signal diagram of a primary control signal provided to a mixer;

FIG. 4A$ii$ is a signal diagram of a signal that represents the complement of the signal in FIG. 4A$i$;

FIG. 4B$i$ is a signal diagram of a primary control signal that is 180 degrees out of phase compared to the primary control signal of FIG. 4A$i$;

FIG. 4B$ii$ is a signal diagram of a signal that represents the complement of the signal in FIG. 4B$i$;

FIG. 4C$i$ is a signal diagram of a primary control signal that is 90 degrees out of phase compared to the primary control signal of FIG. 4A$i$;

FIG. 4C$ii$ is a signal diagram of a signal that represents the complement of the signal in FIG. 4C$i$;

FIG. 4D$i$ is a signal diagram of a primary control signal that is 270 degrees out of phase compared to the primary control signal of FIG. 4A$i$;

FIG. 4D$ii$ is a signal diagram of a signal that represents the complement of the signal in FIG. 4D$i$;

DETAILED DESCRIPTION OF THE INVENTION

The present invention extends to both circuits and methods for the direct conversion of radio frequency (RF) modulated signal into a corresponding baseband signal without requiring conversion through an intermediate frequency. This description will first define certain terms that are to be applied throughout this description and in the claims. The description will then detail a specific embodiment of the present invention.

In this description and in the claims, "radio frequency" or "RF" is defined as any frequency that is suitable for wireless communications. Typical RF frequencies range from several kilohertz to tens of gigahertz. In the future, it is possible that wireless communication using greater frequencies may become possible. It is intended that such frequencies also be included within the definition of "radio frequency" so long as such frequencies are suitable for wireless communications.

In this description and in the claims, a "baseband signal" is an original signal before it is modulated on a radio frequency wave in preparation for wireless transmission at the transmitter end. The baseband signal is typically extracted or demodulated from the radio frequency wave at the receiver end with, of course, some level of distortion from the original signal. The baseband signal most directly represents the data involved in the transmission.

In this description and in the claims, "radio frequency modulated signal", "RF modulated signal" and "RF signal" refer to a signal in which a baseband signal is modulated on an RF carrier wave. The details of embodiments of the present invention will now be described.

Figure 2:
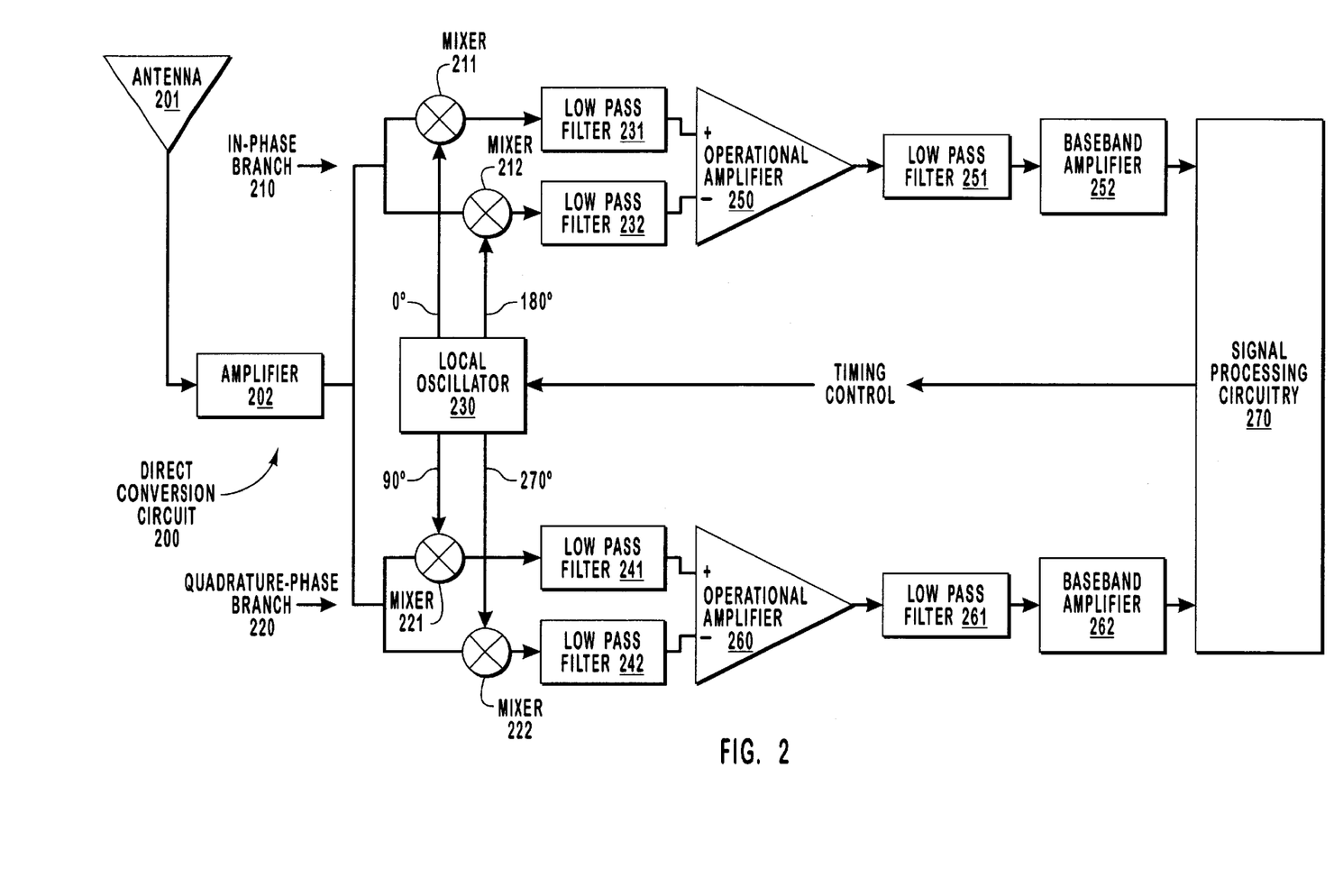
FIG. 2 illustrates a direct conversion circuit in accordance with the present invention in which two mixers are provided for each branch, and in which the output from the mixers is provided to operational amplifiers.

FIG. 2 illustrates a direct conversion circuit 200 in accordance with the present invention. The direct conversion circuit may be implemented in, for example, a wireless receiver and operates to directly convert an RF signal into a corresponding baseband signal without requiring an intermediate conversion through an intermediate frequency.

Figure 3:
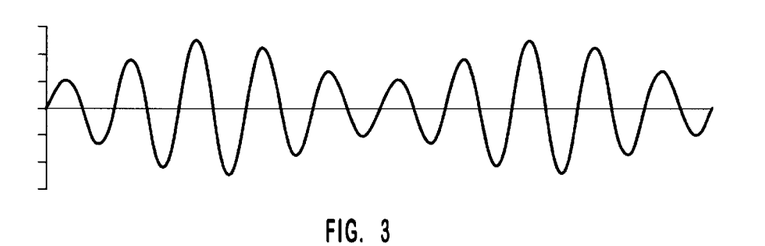
FIG. 3 is a signal diagram of a RF signal received at the direct conversion circuit of FIG. 2.
Figure 4:
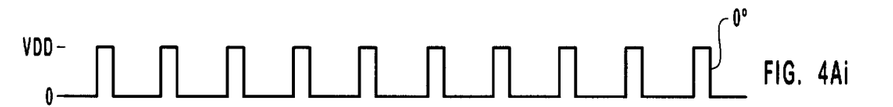

The circuit includes an antenna 201, which receives an RF signal in which a baseband signal is modulated on an RF carrier wave. The RF signal then passes through an RF low noise amplifier 202, which amplifies the RF signal in preparation for further processing. FIG. 3 illustrates a waveform of an example amplified RF signal in which the magnitude of the RF signal is plotted vertically, and in which the passage of time is plotted horizontally.

Figure 7:
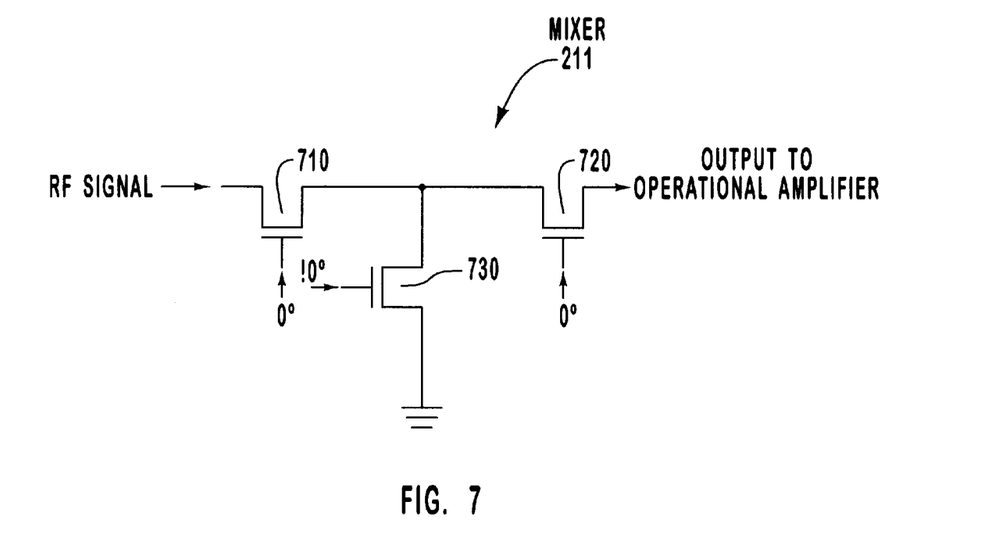
FIG. 7 is a circuit diagram of a mixer that may be used as the mixer shown in FIG. 2.
Figure 8:
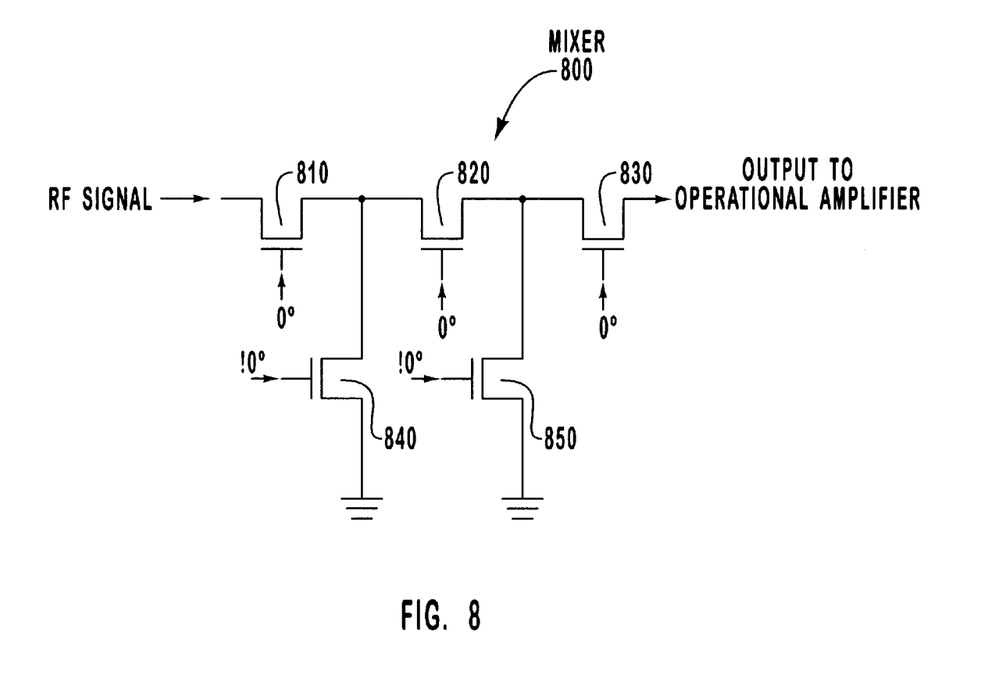
FIG. 8 is a circuit diagram of another mixer that may be used as the mixer shown in FIG. 2.

The amplified RF signal from the output terminal of the RF amplifier 202 is then provided to an "in-phase" branch 210 and a "quadrature-phase" branch 220. Instead of each branch conventionally having one mixer, each branch contains two mixers. For example, the in-phase branch 210 includes mixers 211 and 212, and the quadrature-phase branch 220 includes mixers 221 and 222. Each mixer 211, 212, 221 and 222 receives the amplified RF signal and is configured to pass the RF signal only if a corresponding control signal provided to the mixer is high. Mixers 211, 212, 221, and 222 represent examples of a means for passing the RF signal at the carrier frequency of the RF signal. FIG. 7 and FIG. 8 illustrate circuit diagrams of mixers that are suitable for the present invention and also represent examples of a means for passing the RF signal.

A local oscillator 230 represents an example of a means for controlling the means for passing so that all of the means for passing (i.e., the mixers) pass out of phase with each other as described herein. The local oscillator 230 provides the control signals that control whether or not each mixer passes the amplified RF signal. The oscillator 230 provides a total of eight control signals to the mixers in aggregate. A primary control signal and its binary complement are provided to each mixer.

For example, the oscillator 230 provides a primary control signal 0° (see FIG. 4A$i$) and an inverted control signal 10° (see FIG. 4A$ii$) to the mixer 211, a primary control signal 180° (see FIG. 4B$i$) and an inverted control signal 1180° (see FIG. 4B$ii$) to the mixer 212, a primary control signal 90° (see FIG. 4C$i$) and an inverted control signal 190° (see FIG. 4C$ii$) to the mixer 221, and a primary control signal 270° (see FIG. 4D$i$) and an inverted control signal 1270° (see FIG. 4D$ii$) to the mixer 222.

Each inverted control signal is the binary complement of the primary control signal. Each primary/inverted signal pair represents a balanced control signal, the control signal being "balanced" since the superposition of the primary and inverted control signals results in a substantially constant signal.

Each primary control signal 0°, 90°, 180° and 270° is a binary periodic wave having a duty cycle (high state condition) of approximately 25%. The primary control signal 90° is approximately 90 degrees out of phase with the primary control signal 0°; the primary control signal 180° is approximately 180 degrees out of phase with the primary control signal 0°; and the primary control signal 270° is approximately 270 degrees out of phase with the primary control signal 0°.

Figure 5A:
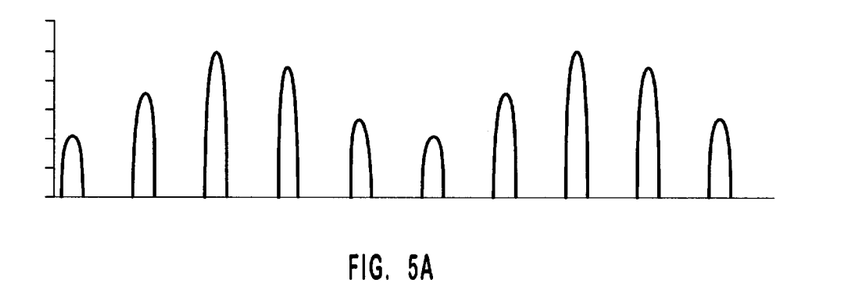
FIG. 5A is a signal diagram of the signal output from the upper-most mixer of the in-phase branch as shown in FIG. 2.
Figure 5B:
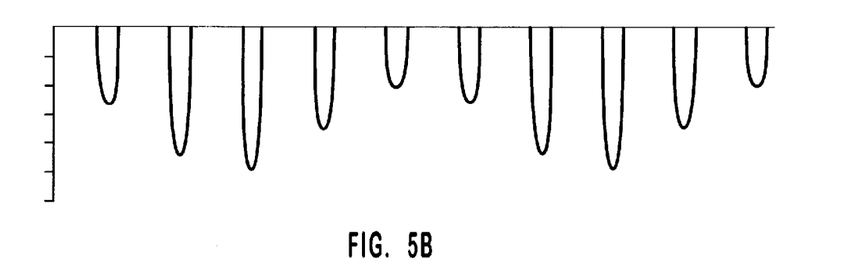
FIG. 5B is a signal diagram of the signal output from the lower-most mixer of the in-phase branch.

The signal processing of the in-phase branch 210 with respect to the example amplified RF signal of FIG. 3 will now be described with reference to FIGS. 5A through 5D. FIG. 5A illustrates the output signal from the mixer 211, which passes the amplified signal only when the primary control signal 0° (see FIG. 4A$i$) is high. FIG. 5B illustrates the output signal from the mixer 212, which passes the amplified signal only when the primary control signal 180° (see FIG. 4B$i$) is high.

The output signals shown in FIGS. 5A and 5B are passed to an operational amplifier 250 (see FIG. 2). The signals optionally pass first through the low pass filters 231 and 232 respectively in order to eliminate any high frequency anomalous components generated at the mixers. The operational amplifier 250 generates a signal that has the magnitude at any given time equal to the magnitude of the signal from the mixer 211 (FIG. 5A) minus the magnitude of the signal from the mixer 212 (FIG. 5B). This resulting signal is shown in FIG. 5C.

Figure 5C:
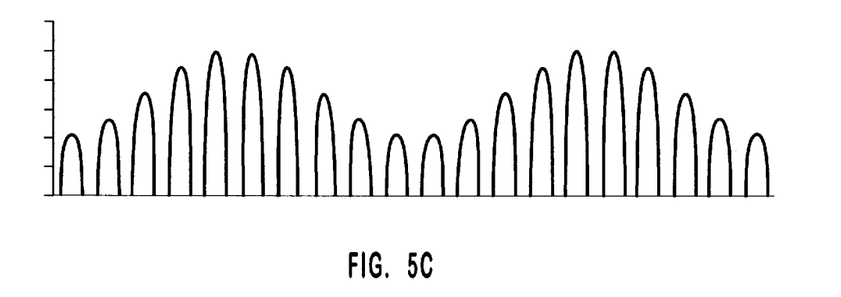
FIG. 5C is a signal diagram of the signal output from the operational amplifier of the in-phase branch.
Figure 5D:
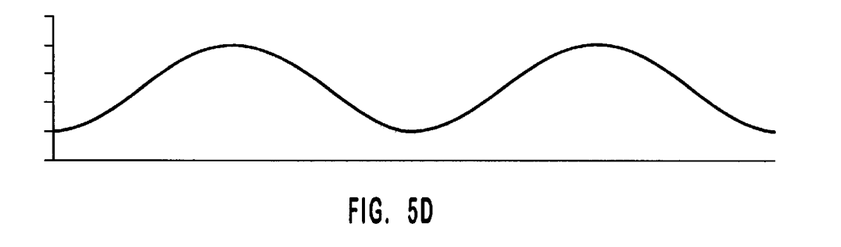
FIG. 5D is a signal diagram of the signal (i.e., the baseband signal) output from the low pass filter of the in-phase branch.

The signal of FIG. 5C then passes through a low pass filter 251 which filters out high frequency components. The resulting baseband signal is illustrated in FIG. 5D. This baseband signal component is then amplified by the baseband amplifier 252 for further processing by the signal processing circuitry 270.

The signal processing of the quadrature-phase branch 220 with respect to the example amplified RF signal of FIG. 3 will now be described with reference to FIGS. 6A through 6C.

Figure 6A:
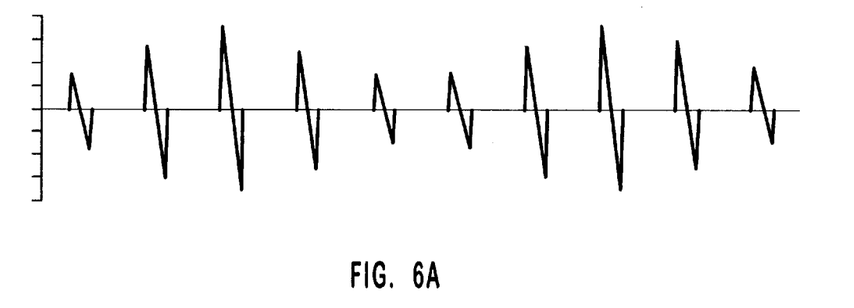
FIG. 6A is a signal diagram of the signal output from the upper-most mixer of the quadrature-phase branch as shown in FIG. 2.

FIG. 6A illustrates the output signal from the mixer 221, which passes the amplified signal only when the primary control signal 90° (see FIG. 4Ci) is high. FIG. 6B illustrates the output signal from the mixer 222, which passes the amplified signal only when the primary control signal 270° (see FIG. 4Di) is high.

Figure 6B:
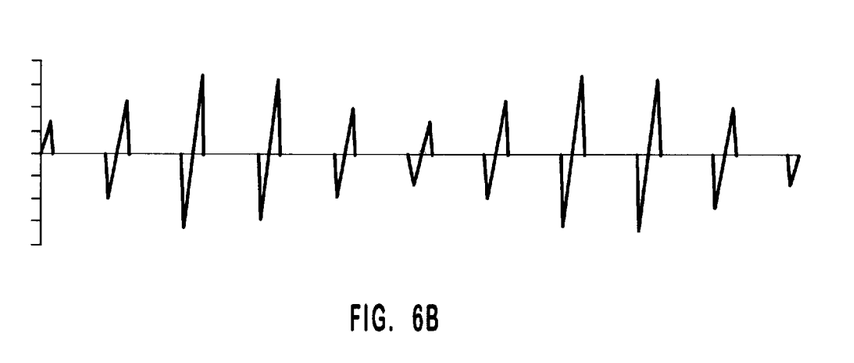
FIG. 6B is a signal diagram of the signal output from the lower-most mixer of the quadrature-phase branch.

The output signals shown in FIGS. 6A and 6B are passed to an operational amplifier 260. The signals optionally pass first through the low pass filters 241 and 242 respectively in order to eliminate any high frequency anomalous components generated at the mixers. The operational amplifier 260 generates a signal that has the magnitude at any given time equal to the magnitude of the signal from the mixer 221 (FIG. 6A) minus the magnitude of the signal from the mixer 222 (FIG. 6B). This resulting signal is shown in FIG. 6C.

Figure 6C:
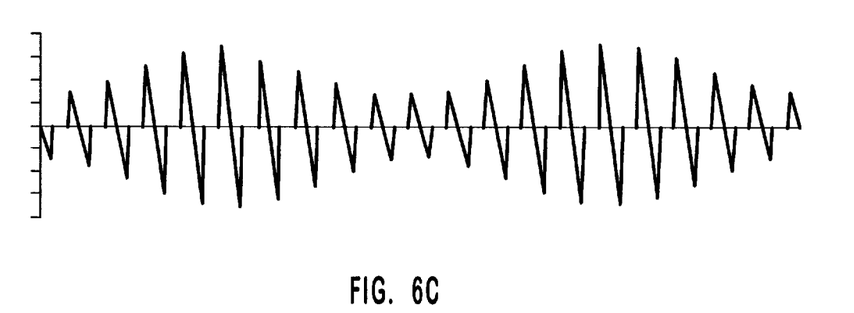
FIG. 6C is a signal diagram of the signal output from the operational amplifier of the quadrature-phase branch.

The signal of FIG. 6C then passes through a low pass filter 261 which filters out high frequency components. Because the signal of FIG. 6C remains at zero except for some high frequency variation that is reasonably balanced above and below zero, the high-frequency signal is essentially filtered out entirely so as to be at the zero state. If there was a signal from the operational amplifier 260, this signal would then pass through a baseband amplifier 262 and on for further processing at the signal processing circuitry 270.

The resulting baseband signal is zero at the quadrature branch because the in-phase branch control signals 0° and 180° are timed to be in phase with the peaks of the amplifier RF signal shown in FIG. 3. Thus, the quadrature-phase control signals are timed to be high where the RF signal transitions between positive and negative magnitudes. This timing is an optional feature provided by signal processing circuitry 270. If there were no such timing control, both the in-phase and quadrature-phase branches would provide a baseband signal component to the signal processing circuitry 270. Thus, the signal processing circuitry 270 must either be able to control the timing of the local oscillator 230, or be able to evaluate two baseband signal components to reconstruct the original baseband signal.

One skilled in the art will recognize that as long as the primary control signals 0° and 180° are timed to be in phase with the peaks of the amplifier RF signal shown in FIG. 3, that the baseband signal may be extracted from the in-phase branch alone. Thus, the quadrature phase branch may be eliminated in this context. However, the output from the quadrature-phase branch may be useful for the signal processing circuitry to time the oscillator to so that the primary control signals 0° and 180° are in phase with the peaks of the amplified RF signal. For example, the signal processing circuitry may adjust the timing until the signal provided by the quadrature-phase branch is reduced almost to zero magnitude.

As explained above, the circuit of FIG. 2 allows the baseband signal to be extracted from an RF signal for further processing by downstream signal processing circuitry. The advantages of the circuit of FIG. 2 as compared to the conventional direct conversion circuits will be explained after the following description of the mixers.

FIG. 7 illustrates in further detail the mixer 211 of FIG. 2. The other mixers 212, 221, and 222 of FIG. 2 are structured similar to the mixer shown in FIG. 7 except for the control signals they receive are, of course, different as described above.

The mixer 211 is often called a "T" switch and is composed of two on-off Single Pole, Single Throw (SPST) switches 710 and 720 connected in series between the input signal (i.e., the amplified RF signal) and the output signal. The mixer also includes a shunt SPST switch 730 connecting the common node of the series switches to ground. The control signal 0° is provided to the gate of the series switches which may each be an nMOS transistor. The complementary control signal 10° is provided to the gate of the shunt switch 730 which may also be an nMOS transistor.

Each of the switches 710, 720 and 730 is closed when the control signal voltage applied at its gate is high, and is otherwise open. When the control signal 0° is high (and the control signal 10° is low), the switches 710 and 720 are closed and the switch 730 is open. Thus, the RF signal passes through the switches 710 and 720 and is output to the operational amplifier.

When the control signal 0° is low, switches 710 and 720 are open. Thus, the mixer is off and the RF signal is not passed to the operational amplifier. Also in this off condition, since the control signal 0° is low, the complementary control signal 10° is high thereby grounding the common node of the series switches to ground through the shunt switch 730. This improves the off condition by reducing leakage current in the series switches.

In another embodiment of the mixer, three or more switches may be coupled in series between the amplified RF signal input and the output. In this embodiment, a shunt switch would be provided for each common node thus grounding each common node when the mixer is off. This alternative embodiment is especially advantageous for high frequency RF signals thus extending the operating frequency range of the direct conversion circuit of FIG. 2.

FIG. 8 illustrates a mixer 800 in accordance with an alternative embodiment of the invention. The mixer includes three series switches 810, 820 and 830 coupled between the input terminal that receives the RF signal and the output terminal. The mixer also includes a shunt switch 840 coupled between ground and the common node of switches 810 and 820, and a shunt switch 850 coupled between ground and the common node of switches 820 and 830.

As mentioned above, the direct conversion circuit 200 operates to receive wireless RF signals. Accordingly, the direct conversion circuit should preferably be manufactured using a technology that is suited for RF radio or wireless technologies. These technologies might include, for example, deep submicron CMOS, CMOS-on-SOI, BiCMOS, SiGe and GaAs semiconductor technologies. Deep submicron CMOS is preferred since it is low cost and has high integration capability.

The direct conversion circuit described herein has many advantages over conventional direct conversion circuits. Specifically, the signals provided to each mixer are balanced complementary signals. Thus, any leakage from a pair of complementary signals tends to cancel each other out. Also, the superposition of the two primary switching control signals provided to each branch is a square wave at twice the RF carrier frequency. Likewise, the superposition of the two complementary switching control signals provided to each branch is also a square wave at twice the RF carrier frequency. Therefore, this superposition contains only even-order harmonics of the receive frequency thus reducing interference with the received signal.

Also, coupling of the four switching control signal waveforms in the two switching mixers of each branch via a capacitive leakage path to a distant node results in an "impulse train" at that node which is balanced. Impulse trains occur at the leading and lagging edges of the control signals thus forming a positive-going impulse train at four times the receive frequency and a coincident negative-going impulse train at four times the receive frequency. Thus, coupling along balanced leakage paths tend to cancel each other.

In addition, the superposition of all eight control signals is a balanced waveform that contains no spectral components at the receive frequency. These effects combine to reduce the local oscillator leakage to surrounding components including the antenna.

Furthermore, the circuit results in reduced AM detection in the mixers due to the use of switches for mixers, as opposed to "active" mixer implementations such as Gilbert cells. Switching mixers can be implemented with active semiconductor switching devices where the degree of non-linearity incurred across the switch itself in the "on" state is less than with Gilbert cells or semiconductor diode ring devices. Therefore, larger second order and third order intercept values can be realized.

Figure 9:
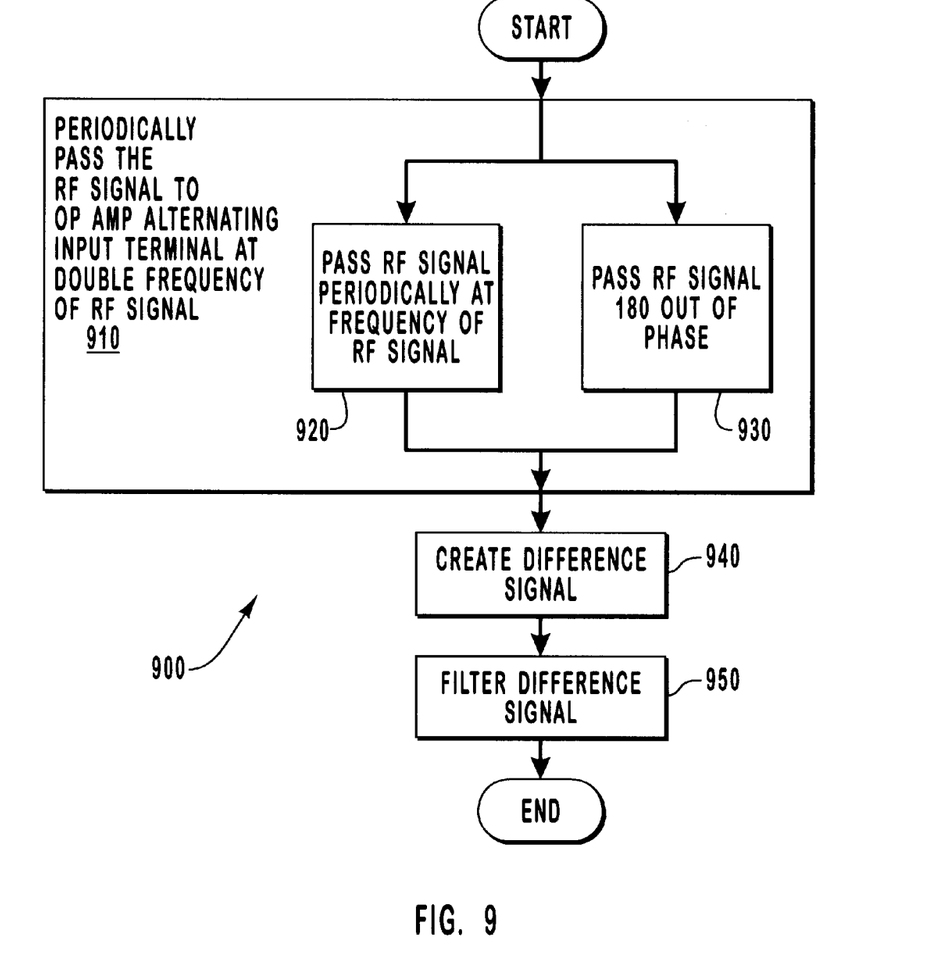
FIG. 9 illustrates a flowchart of a method implemented by the circuit of FIG. 2 for extracting the baseband signal from the received RF signal.

FIG. 9 flowcharts a method 900 of extracting a baseband signal from the RF signal and may be performed for each branch both in-phase and quadrature-phase. First, the method performs a step for periodically passing the RF modulated signal to an operational amplifier at alternating input terminals at double the frequency of the carrier frequency of the radio frequency modulated signal. For the in-phase branch, the passed RF signal is represented by the combination of the signal of FIG. 5A and the signal of FIG. 5B.

Now specifically describing the corresponding acts associated with this step, the signal of FIG. 5A (in which the RF signal is periodically represented) is passed to the positive terminal of the operational amplifier (act 920). Also, the signal of FIG. 5B (in which the RF signal is periodically represented at 180 degrees out of phase) is passed to the negative terminal of the operational amplifier (act 930). This passing may occur as described above.

Next, the difference signal is created (act 940), the difference signal representing the difference in magnitude at any given time between the passed signal at the positive terminal (the signal of FIG. 5A) and the passed signal at the negative terminal (the signal of FIG. 5B) of the operational amplifier. The difference signal from the in-phase branch is represented by the signal of FIG. 5C. The difference signal is then filtered (act 950) to remove high frequency components. The resulting signal for the in-phase branch is illustrated in FIG. 5D.

In summary, the circuit described herein overcomes many of the disadvantages inherent in conventional direct conversion circuits thus allowing direct conversion to be more readily adopted and thus improving on prior state of the art.

Optimal performance is achieved when the primary control signals 90°, 180° and 270° are very close to exactly 90 degrees, 180 degrees, and 270 degrees, respectively, out of phase from the primary control signal 0°. However, as the phases vary from 90 degrees, 180 degrees, and 270 degrees, the performance of the direct conversion amplifier will gradually degrade. Realizing that exact precision in phasing is difficult, if not impossible, to achieve, there will likely be some variance from 90 degrees, 180 degrees, and 270 degrees in practical implementation. Thus, in this description and in the claims, these degree values are emphasized to be "approximate." "Approximate" in this context means that the phase should be close enough to the value that the direct conversion amplifier illustrated in FIG. 2 is suitable for receiving a wireless RF signal and extracting a baseband signal from the RF signal.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A direct conversion receiver for converting a radio frequency modulated signal into a corresponding baseband signal without requiring conversion through an intermediate frequency while abating local oscillator leakage, increasing dynamic range and increasing RF selectivity, the direct conversion circuit comprising the following:

an oscillator component configured to generate a plurality of binary control signals, each binary control signal having a frequency substantially equal to the radio carrier frequency of the radio frequency modulated signal or substantially equal to the odd subharmonic of the radio frequency modulated signal, the plurality of binary control signals including the following:
a first binary control signal that has a duty cycle of approximately twenty-five percent of the radio frequency modulated signal where the first binary control signal is high;
a first complement binary control signal that is the approximate complement of the first binary control signal;
a second binary control signal that is approximately 180 degrees out of phase with the first binary control signal and that has a duty cycle of approximately twenty-five percent of the radio frequency modulated signal where the second binary control signal is high; and
a second complement binary control signal that is the approximate complement of the second binary control signal;

a plurality of switches, each switch having an input, an output, and control terminals, each switch configured to pass the radio frequency modulated signal from its input terminal to its output terminal according to the control signals on its control terminals, the plurality of switches comprising the following:
a first switch configured to receive at its control terminals the first binary control signal and the first complement binary control signal; and
a second switch configured to receive at its control terminals the second binary control signal and the second complement binary control signal.

2. The direct conversion receiver in accordance with claim 1, wherein the plurality of binary control signals further include the following:
  a third binary control signal that is approximately 90 degrees out of phase with the first binary control signal and that has a duty cycle of approximately twenty-five percent of the radio frequency modulated signal where the third binary control signal is high;
  a third complement binary control signal that is the approximate complement of the third binary control signal;
  a fourth binary control signal that is approximately 270 degrees out of phase with the first binary control signal and that has a duty cycle of approximately twenty-five percent of the radio frequency modulated signal where the fourth binary control signal is high; and
  a fourth complement binary control signal that is the approximate complement of the fourth binary control signal,
and wherein the plurality of switches further comprises the following:
  a third switch configured to receive at its control terminals the third binary control signal and the third complement binary control signal; and
  a fourth switch configured to receive at its control terminals the fourth binary control signal and the fourth complement binary control signal.

3. The direct conversion circuit in accordance with claim 1, wherein the first switch comprises the following:
  a first single pole single throw (SPST) switch coupled between the input terminal and a common node of the first switch, the first SPST switch configured to receive the first binary control signal so as to close when the first binary control signal is high;
  a second SPST switch coupled between the common node and the output terminal of the first switch, the second SPST switch configured to receive the first binary control signal so as to close when the first binary control signal is high, wherein the input terminal of the first switch is connected to the output terminal of the first switch through the first and second SPST switches when the first binary control signal is high; and
  a first shunt SPST switch coupled between the common node and a voltage source of the first switch, the shunt SPST configured to receive the first complementary binary control signal so as to close when the first complementary binary control signal is high.

4. The direct conversion circuit in accordance with claim 3, wherein the second switch comprises the following:
  a third single pole single throw (SPST) switch coupled between the input terminal and a common node of the second switch, the third SPST switch configured to receive the second binary control signal so as to close when the second binary control signal is high;
  a fourth SPST switch coupled between the common node and the output terminal of the second switch, the fourth SPST switch configured to receive the second binary control signal so as to close when the second binary control signal is high, wherein the input terminal of the second switch is connected to the output terminal of the second switch through the third and fourth SPST switches when the second binary control signal is high; and
  a second shunt SPST switch coupled between the common node and a voltage source of the second switch, the shunt SPST switch configured to receive the second complement binary control signal so as to close when the second complement binary control signal is high.

5. The direct conversion circuit in accordance with claim 3, wherein the first and second SPST switches and the first shunt SPST switch are nMOS transistors.

6. The direct conversion circuit in accordance with claim 1, wherein the first switch comprises the following:
  at least a first, second and third SPST switch coupled in series between the input terminal and the output terminal of the first switch, wherein the control terminal of each of the at least first, second and third SPST switch is configured to receive the first binary control signal so as to close and couple the input terminal of the first switch to the output terminal of the first switch when the first binary control signal is high; and
  a shunt SPST switch coupled between at least one of the common nodes and a voltage source of the first switch, wherein the shunt SPST switch is configured to receive the first complement binary control signal so as to close when the first complement binary control signal is high.

7. The direct conversion circuit in accordance with claim 6, wherein the first, second and third SPST switches and the shunt SPST switch are nMOS transistors.

8. The direct conversion circuit in accordance with claim 1, further comprising an amplifier for amplifying the radio frequency modulated signal prior to being forwarded to the plurality of switches.

9. The direct conversion circuit in accordance with claim 1, further comprising an antenna for receiving the radio frequency modulated signal prior to being forwarded to the plurality of switches.

10. The direct conversion circuit in accordance with claim 1, further comprising signal processing circuitry.

11. The direct conversion circuit in accordance with claim 10, wherein the signal processing circuitry controls the timing of the plurality of binary control signals.

12. A direct conversion receiver in accordance with claim 1, further comprising the following:
  a first operational amplifier having input terminals coupled to the output terminals of the first and second switches; and
  a first low pass filter having an input terminal coupled to the output terminal of the first operational amplifier and configured to output a first baseband signal.

13. A direct conversion receiver for converting a radio frequency modulated signal into a corresponding baseband signal without requiring conversion through an intermediate frequency while abating local oscillator leakage, increasing dynamic range and increasing RF selectivity, the direct conversion circuit comprising the following:
  an antenna configured to receive the radio frequency modulated signal;
  an amplifier configured to receive and amplify the radio frequency modulated signal received by the antenna;
  an oscillator component configured to generate a plurality of control signals, each control signal having a frequency substantially equal to the radio carrier period of the radio frequency modulated signal or substantially equal to the odd subharmonic of the radio frequency modulated signal, the plurality of control signals including the following:
    a first control signal;
    a first complement control signal;
    a second control signal that is approximately 180 degrees out of phase with the first control signal;

a second complement control signal;
a third control signal that is approximately 90 degrees out of phase with the first control signal;
a third complement control signal;
a fourth control signal that is approximately 270 degrees out of phase with the first control signal; and
a fourth complement control signal,
a plurality of mixers, each mixer having an input, an output, and control terminals, each mixer configured to receive the radio frequency modulated signal from the amplifier and pass the radio frequency modulated signal from its input terminal to its output terminal according to the signals on its control terminals, the plurality of mixers comprising the following:
  a first mixer configured to receive at its control terminals the first control signal and the first complement control signal, wherein the first mixer comprises the following:
    a first nMOS transistor coupled between the input terminal and a common node of the first mixer, the first nMOS transistor configured to receive the first control signal so as to close when the first control signal is high;
    a second nMOS transistor coupled between the common node and the output terminal of the first mixer, the second nMOS transistor configured to receive the first control signal so as to close when the first control signal is high, wherein the input terminal of the first mixer is connected to the output terminal of the first mixer through the first and second nMOS transistors when the first control signal is high; and
    a first shunt nMOS transistor coupled between the common node and a voltage source of the first mixer, the shunt nMOS transistor configured to receive the first complement control signal so as to close when the first complement control signal is high;
  a second mixer configured to receive at its control terminals the second control signal and the second complement control signal;
  a third mixer configured to receive at its control terminals the third control signal and the third complement control signal; and
  a fourth mixer configured to receive at its control terminals the fourth control signal and the fourth complement control signal;
a first operation amplifier having input terminals coupled to the output terminals of the first and second mixers; and
a first low pass filter having an input terminal coupled to the output terminal of the first operational amplifier and configured to output a first baseband signal,
a second operation amplifier having input terminals coupled to the output terminals of the third and fourth mixers; and
a second low pass filter having an input terminal coupled to the output terminal of the second operational amplifier and configured to output a second baseband signal.

* * * * *

UNITED STATES PATENT AND TRADEMARK OFFICE
CERTIFICATE OF CORRECTION

PATENT NO.    : 6,711,397 B1
DATED         : March 23, 2004
INVENTOR(S)   : Petrov et al.

It is certified that error appears in the above-identified patent and that said Letters Patent is hereby corrected as shown below:

Column 2,
Line 37, change "possible" to -- possibly --
Line 49, before "intermediate" change "and" to -- an --
Line 66, after "branch." remove """

Column 3,
Line 3, before "signals" change "controls" to -- control --

Column 5,
Line 28, before "radio frequency" insert -- a --

Column 6,
Line 30, after "control signal" change "10º" to -- !0º --
Line 32, after "control signal" change "1180º" to -- !180º --
Line 34, after "control signal" change "1190º" to -- !190º --
Line 36, after "control signal" change "1270º" to -- !270º --

Column 7,
Line 62, after "the oscillator" remove "to"

Column 8,
Line 20, after "control signal" change "10º" to -- !0º --
Lines 25 and 33, after "signal" change "10" to -- !0º --

Signed and Sealed this

Twenty-sixth Day of October, 2004

JON W. DUDAS
*Director of the United States Patent and Trademark Office*